US007196641B2

(12) United States Patent
Huang et al.

(10) Patent No.: US 7,196,641 B2
(45) Date of Patent: Mar. 27, 2007

(54) SYSTEM AND METHOD FOR AUDIO DATA COMPRESSION AND DECOMPRESSION USING DISCRETE WAVELET TRANSFORM (DWT)

(76) Inventors: Gen Dow Huang, F-16-5, No. 398 Han-Pei Road, Chung-li City, Tuoyuan Hsien (TW); Charles Hsu, 6864 Chelsea Rd., McLean, VA (US) 22101

( * ) Notice: Subject to any disclaimer, the term of this patent is extended or adjusted under 35 U.S.C. 154(b) by 0 days.

(21) Appl. No.: 11/114,200

(22) Filed: Apr. 26, 2005

(65) Prior Publication Data

US 2006/0238386 A1 Oct. 26, 2006

(51) Int. Cl.
*H03M 7/00* (2006.01)

(52) U.S. Cl. ........................................ 341/50; 382/240

(58) Field of Classification Search .................. 341/50, 341/162; 382/240, 239, 266, 246, 100; 704/203; 708/400; 702/66; 375/240.19, 375/240.01

See application file for complete search history.

(56) References Cited

U.S. PATENT DOCUMENTS 2,950,469 A * 8/1960 Raasch ........................ 341/162
4,152,691 A * 5/1979 Ward ........................... 367/43
5,347,479 A * 9/1994 Miyazaki ..................... 708/400
5,949,912 A * 9/1999 Wu ............................. 382/246
6,148,111 A * 11/2000 Creusere ...................... 382/240
6,148,115 A * 11/2000 Mackinnon et al. ........ 382/266
6,249,749 B1 * 6/2001 Tran et al. ..................... 702/66
6,301,368 B1 * 10/2001 Bolle et al. ................. 382/100
6,483,946 B1 * 11/2002 Martucci et al. ............ 382/240
6,504,494 B1 * 1/2003 Dyas et al. .................... 341/50
6,560,369 B1 * 5/2003 Sato ........................... 382/239
6,570,510 B2 5/2003 Chen et al.
6,628,717 B1 * 9/2003 Jeong et al. ........... 375/240.19
6,643,406 B1 * 11/2003 Hajjahmad et al. ......... 382/240
6,658,379 B1 * 12/2003 Ogata ......................... 704/203
6,798,917 B2 * 9/2004 Fujiwara et al. ............ 382/240
6,831,946 B1 * 12/2004 Jeong .................... 375/240.01
6,961,472 B1 * 11/2005 Acharya et al. ............ 382/240

OTHER PUBLICATIONS

Martin Boliek et al., "Coding of Still Pictures", ISO/IEC/JTC 1/SC 29/WG 1 (Mar. 16, 2000), 192 pages.

(Continued)

*Primary Examiner*—Jean Bruner Jeanglaude
(74) *Attorney, Agent, or Firm*—Reed Smith LLP; Stanley P. Fisher, Esq.; Juan Carlos A. Marquez, Esq.

(57) ABSTRACT

A system for audio data processing including sub-systems for compression and for de-compression. The compression sub-system includes an AD converter, a segment-based multi-channel splitter splitting and segmenting signals into channels each with segments, multi-level 1D discrete wavelet transformers each discrete wavelet transforming for a respective channel each segment thereof in sequence and recursively through a predetermined number of filtering levels into wavelet coefficients, quantizers, a multiplexer multiplexing quantized wavelet coefficients into 2-D arrays, and an embedded block coder coding the 2-D arrays into code blocks, discarding some of the code blocks, truncating a bit stream embedded in each remaining code block, and stringing the truncated bit stream embedded in each remaining code block into a compressed data stream. Another compression sub-system includes a non-segment-based multi-channel splitter, and a plurality groups of 1D discrete wavelet transformers.

18 Claims, 12 Drawing Sheets

OTHER PUBLICATIONS

Don-Mei He et al., "Wideband Speech and Audio Coding Based on Wavelet Transform and Psychoacoustic Model", Department of Computer Science and Engineering, Harbin Institute of Technology, 4 pages, no date.

George Tzanetakis et al., "Audio Analysis Using the Discrete Wavelet Transform", Computer Science Department, Princeton, 6 pages, no date.

Brani Vidakovic et al., "Wavelets for Kids, a Tutorial Introduction", pp. 1-28, no date.

Ashish Aggarwal et al., "Perceptual Zerotrees for Scalable Wavelet Coding of Wideband Audio", Signal Compression Lab, Department of Electrical and Computer Engineering, University of California, 3 pages, no date.

David Taubman, "High Performance Scalable Image Compression with EBCOT", School of Electrical Engineering, The University of New South Wales, Sydney, Australia, 5 pages, no date.

Huakai Zhang et al., "EBCOT Coprocessing Architecture for JPEC2000", Dept. of Computer Science and Engineering, Washington University, St. Louis, MO., 8 pages, month unknown.

* cited by examiner

*Prior Art*

*Prior Art*

*Prior Art*

| | | |
|---|---|---|
| D0 | V0 | D1 |
| H0 | x | H1 |
| D2 | V1 | D3 |

Fig. 11

*Prior Art*

| Coding Passes | | | | | |
|---|---|---|---|---|---|
| | 10 | 1 | 3 | -7 | Coefficient value |
| | + | + | + | - | Coefficient sign |
| | 1<br>0<br>1<br>0 | 0<br>0<br>0<br>1 | 0<br>0<br>1<br>1 | 0<br>1<br>1<br>1 | Coefficient magnitude (MSB to LSB) |
| Cleanup | 1+ | 0 | 0 | 0 | |
| Significance | | 0 | | | |
| Refinement | 0 | | | | |
| Cleanup | | | 0 | 1- | |
| Significance | | 0 | 1+ | | |
| Refinement | 1 | | | 1 | |
| Cleanup | | | | | |
| Significance | | 1+ | | | |
| Refinement | 0 | | 1 | 1 | |
| Cleanup | | | | | |

Fig. 12

SYSTEM AND METHOD FOR AUDIO DATA COMPRESSION AND DECOMPRESSION USING DISCRETE WAVELET TRANSFORM (DWT)

BACKGROUND OF THE INVENTION

1. Field of the Invention

The present invention relates to an audio data processing (compression & decompression) system, method, and implementation in order to provide a high-speed, high-compression, high-quality, multiple-resolution, versatile, and controllable audio signal communication system. Specifically, the present invention is directed to a wavelet transform (WT) system for digital data compression in audio signal processing. Due to a number of considerations and requirements of the audio communication device and system, the present invention is directed to provide highly efficient audio compression schemes, such as a segment-based channel splitting scheme or a non-segment-based no-latency scheme, for local area multiple-point to multiple-point audio communication.

2. Description of the Related Art

Musical compact discs become popular and widespread since 1990s. Compact discs digitally store music by a sample frequency of 44.1K, i.e., taking 16-bit samples 44.1 thousand times each channel for stereo per second. Unfortunately, such a scheme involves a large amount of data—about 10 MB per minute of audio, which makes it difficult and inefficient to distribute music over the internet. Audio compression thus becomes necessary to reduce the amount of audio data with an acceptable quality. Lossless compression (reducing information redundancy) is used by audio professionals for further processing (later work on samples for example). People who trade live recordings often use lossless formats. While lossless compression, recovering all original audio signals, guarantees music quality, the amount of data involved remains large—typically 70% of the original format.

On the other hand, lossy compression is not a flawless compression (i.e. redundancy reduction is not reversible), but an irrelevance coding (i.e. an irrelevance reduction). Lossy compression removes irrelevant information from the input in order to save space and bandwidth cost so as to store/transfer much smaller music files. In other words, sounds considered perceptually irrelevant are coded with decreased accuracy or not coded at all. This is done at the cost of losing some irrelevant data but maintaining the audible quality of the music. Although the nature of audio waveforms makes them generally difficult to simplify without a (necessarily lossy) conversion to frequency information, as performed by the human ear. As values of audio samples change very quickly, so generic data compression algorithms without spectrum analysis don't work well for audio, and strings of consecutive bytes don't generally appear very often. The common lossy compression standards include MP3, VQF, OGG and MPC. Sony minidiscs use a standard by the name of ATRAC [Adaptive TRansform Acoustic Coding].

Compression efficiency of lossy data compression encoders is typically defined by the bitrate, because compression rate depends on bit depth and sampling rate of the input signal. Nevertheless there are often published audio quality which use the CD parameters as references (44.1 kHz, 2×16 bit). Sometimes also the DAT SP parameters are used (48 kHz, 2×16 bit). Compression ratio for this reference is higher, which demonstrates the problem of the term compression ratio for lossy encoders.

The focus in audio signal processing is most typically an analysis of which parts of the signal are audible. Which parts of the signal are heard and which are not, is not decided merely by physiology of the human hearing system, but very much by psychological properties. These properties are analyzed within the field of psychoacoustics. It is necessary to exploit psychoacoustic effects to determine how to reduce the amount of data required for faithful reproduction of the original uncompressed audio to most listeners. This is done by conducting hearing tests on subjects to determine how much distortion of the music is tolerable before it becomes un-audible. Another technique is to break the music's frequency spectrum into smaller sections known as subbands. Different resolutions can then be used in each subband to suit the respective requirements. However, the computational complexity of these compression methods is extremely high, costly and difficult to implement.

MP3 enjoys very significant and extremely wide popularity and support, not just by end-users and software, but also by hardware such as DVD players. The bit rate, i.e. the number of binary digits streamed per second, is variable for MP3 files. The general rule is that the higher the bitrate, the more information is included from the original sound file, and thus the higher the quality of played back audio. Bit rates available in MPEG-1 layer 3 are 32, 40, 48, 56, 64, 80, 96, 112, 128, 160, 192, 224, 256 and 320 Kbit/s, and the available sampling frequencies are 32, 44.1 and 48 KHz. 44.1 KHz is used as the sampling frequency of the audio CD, and 128 Kbit has become the de facto "good enough" standard. Many listeners accept the MP3 bitrate of 128 kilobits per second (Kbit/s) as faithful enough to original CDs, which provides a compression ratio of approximately 11:1. Although listening tests show that with a bit of practice, many listeners can reliably distinguish 128 Kbit/s MP3s from CD originals. To some listeners, 128 Kbit/s provides unacceptable quality.

The MPEG-1 standard does not include a precise specification for an MP3 encoder. The decoding algorithm and file format, as a contrast, are well defined. As a result, there are many different MP3 encoders available, each producing files of differing quality. Most lossy compression algorithms use transforms such as the modified discrete cosine transform (MDCT) to convert sampled waveforms into a transform domain. Once transformed, typically into the frequency domain, component frequencies can be allocated bits according to how audible they are. Audibility of spectral components is determined by first calculating a masking threshold, below which it is estimated that sounds will be beyond the limits of human perception.

As the example depicted in FIG. 1, depicted in the paper titled "Lossless Wideband Audio Compression: Prediction and Transform" by Jong-Hwa Kim, MP3 uses a hybrid transform scheme to transform a time domain signal into a frequency domain signal using a 32 band polyphase quadrature filter, 36 or 12 Tap MDCT (size selected independent for subband 0 . . . 1 and 2 . . . 31), and alias reduction post-processing. The MDCT is a Fast Fourier-related transform (FFT) based on the type-IV discrete cosine transform (DCT-IV), with the additional property of being lapped so as to be performed on consecutive blocks of a larger dataset, where subsequent blocks are overlapped so that the last half of one block coincides with the first half of the next block. This overlapping, in addition to the energy-compaction qualities of the DCT, makes the MDCT especially attractive for signal compression applications, since it helps to avoid artifacts stemming from the block boundaries. However, the computational complexity of FFT requires $O(n^2)$ operations (where n is the data size). Even if deploying the preferred butterfly structure of FFT, the computational complexity is still as high as O(n log n).

In MP3, the MDCT is not applied to the audio signal directly, but rather to the output of a 32-band polyphase quadrature filter (PQF) bank. The output of this MDCT is post-processed by an alias reduction formula to reduce the typical aliasing of the PQF filter bank. Such a combination of a filter bank with an MDCT is called a hybrid filter bank or a subband MDCT.

Another prior art problem is latency. Since most of the audio compression standards, e.g., MP3, require frequency analysis to ensure that the parts it removes cannot be detected by human listeners, by modeling characteristics of human hearing such as noise masking. This is important to gain huge savings in storage space with reasonable and acceptable (although detectable) losses in fidelity. The FFT frequency analysis is necessary for determining which subbands are more important than others so more data should be removed thereform. However, the frequency analysis using FFT takes time to accumulate audio samples to obtain frequency spectrum thereby determining the importance of different subbands and treating accordingly. This approach is extremely time consuming and counterproductive to real-time audio processing.

Data sets, e.g., audio data, without obviously periodic components cannot be processed well using Fourier techniques. One feature of wavelets that is critical in areas like signal processing and compression is what is referred to in the wavelet literature as perfect reconstruction. A wavelet algorithm has perfect reconstruction when the inverse wavelet transform of the result of the wavelet transform yields exactly the original data set. Wavelets allow complex filters to be constructed for this kind of data, which can remove or enhance selected parts of the signal. Wavelet transform (WT) or subband coding or multiresolution analysis has a huge number of applications in science, engineering, mathematics and information technology. All wavelet transforms consider a function (taken to be a function of time) in terms of oscillations, which are localized in both time and frequency. All wavelet transforms may be considered to be forms of time-frequency representation and are, therefore, related to the subject of harmonic analysis. An article titled "Wavelets for Kids—A Tutorial Introduction" by Brani Vidakovic and Peter Mueller pointed out important differences between Fourier analysis and wavelets including frequency/time localization and representing many classes of functions in a more compact way. While Fourier basis functions are localized in frequency but not in time, wavelets are local in both frequency/scale (via dilations) and in time (via translations). For example, functions with discontinuities and functions with sharp spikes usually take substantially fewer wavelet basis functions than sine-cosine basis functions to achieve a comparable approximation. Waslets' sparse coding characteristic makes them excellent tools for data compression.

In numerical analysis and functional analysis, the discrete wavelet transform (DWT) refers to wavelet transforms for which the wavelets are discretely sampled. DWT are a form of finite impulse response filter. Most notably, the DWT is used for signal coding, where the properties of the transform are exploited to represent a discrete signal in a more redundant form, such as a Laplace-like distribution, often as a preconditioning for data compression. DWT is widely used in handling video/image compression to faithfully recreate the original images under high compression ratios due to its lossless nature. DWT produces as many coefficients as there are pixels in the image. These coefficients can be compressed more easily because the information is statistically concentrated in just a few coefficients. This principle is called transform coding. After that, the coefficients are quantized and the quantized values are entropy encoded and/or run length encoded. The lossless nature of DWT results in zero data loss or modification on decompression so as to support better image quality under higher compression ratios at low-bit rates and highly efficient hardware implementation. U.S. Pat. No. 6,570,510 illustrates an example of such application. Extensive research in the field of visual compression has led to the development of several successful video compression standards such MPEG 4 and JPEG 2000, both of which allow for the use of Wavelet-based compression schemes.

The principle behind the wavelet transform is to hierarchically decompose the input signals into a series of successively lower resolution reference signals and their associated detail signals. At each level, the reference signals and detailed signals contain the information necessary for reconstruction back to the next higher resolution level. One-dimensional DWT (1-D DWT) processing can be described in terms of a filter bank, wavelet transforming a signal is like passing the signal through this filter bank wherein an input signal is analyzed in both low and high frequency bands. The outputs of the different filter stages are the wavelet and scaling function transform coefficients. A separable two-dimensional DWT (2-D DWT) process is a straightforward extension of 1-D DWT. Specifically, in the 2-D DWT image process, separable filter banks are applied first horizontally and then vertically. The decompression operation is the inverse of the compression operation. Finally, the inverse wavelet transform is applied to the de-quantized wavelet coefficients. This produces the pixel values that are used to create the image.

DWT has been popularly applied to image and video coding applications because of its higher de-correlation WT coefficients and energy compression efficiency, in both temporal and spatial representation. In addition, multiple resolution representation of WT is well suited to the properties of the Human Visual System (HVS). Wavelets have been used for image data compression. For example, the United States FBI compresses their fingerprint data base using wavelets. Lifting scheme wavelets also form the basis of the JPEG 2000 image compression standard. There are a number of applications using wavelet techniques for noise reduction. An article titled "Audio Analysis using the Discrete Wavelet Transform" by Tzanetakis et al. applied DWT to extract information from non-speech audio. Another article titled "De-Noising by Soft-Thresholding" by D. L. Donoho published in *IEEE Transaction on Information Theory*. V41 p613–627, 1995 applied DWT with thresholding operations to de-noise audio signals.

One of big advantages of DWT over the MDCT is the temporal (or spatial) locality of the base functions with the smaller complexity O(n) instead of O(n log n) for the FFT. Comparing with MDCT of MP3, the computational complexity of DWT requires only O(n), since it concerns relative frequency changes, rather than absolute frequency values. Secondly, the DWT captures not only some notion of the frequency content of the input, by examining it at different scales, but also captures temporal content, i.e. the times at which these frequencies occur.

There is a need for a better audio compression scheme via DWT, which provides faithful reproduction of music closer to real-time (less or no latency).

SUMMARY OF INVENTION

It is a major object of the invention to provide an audio compression scheme via DWT, which provides faithful reproduction of music closer to real-time (less or no latency).

It is another object of the invention to provide an audio compression scheme via DWT, which requires easier way of production and lower manufacturing cost.

According to one aspect of the invention, the system for audio data processing includes a sub-system for audio data compression comprising: an analog to digital converter converting analog audio signals into digital audio signals; a segment-based multi-channel splitter splitting the digital audio signals into multiple channels and segmenting split signals in each of the multiple channels into a plurality of segments; a plurality of multi-level 1D discrete wavelet transformers each of which discrete wavelet transforms for a respective one of the multiple channels each of the segments thereof in sequence and recursively through a predetermined number of filtering levels into wavelet coefficients; a plurality of quantizers each of which quantizes for the respective channel the wavelet coefficients thereof; a multiplexer multiplexing quantized wavelet coefficients of the multiple channels into a plurality of 2-D arrays; and an embedded block coder coding the 2-D arrays into a plurality of code blocks, discarding some of the code blocks, truncating a bit stream embedded in each of the remaining code blocks, and stringing the truncated bit stream embedded in each of the remaining code blocks into a compressed data stream.

According to another aspect of the invention, the system for audio data processing further includes a sub-system for audio data de-compression comprising: an embedded block decoder decoding the compressed data stream to provide a plurality of 2-D arrays containing wavelet coefficients in segments; a de-multiplexer de-multiplexing the wavelet coefficients of the 2-D arrays into the multiple channels; a plurality of de-quantizers each of which de-quantizes for a respective one of the multiple channels the decoded wavelet coefficients thereof into de-quantized wavelet coefficients in different levels; a plurality of multi-level 1-D inverse discrete wavelet transformers each of which inversely discrete wavelet transforms for the respective channel the de-quantized wavelet coefficients in different levels in each of the segments thereof in sequence into digital audio data in segments; a segment-based multi-channel mixer mixing the digital audio data in segments of the multiple channels into a stream of digital audio data; and a digital to analog converter converting the digital audio data into analog audio signals.

According to another aspect of the invention, the system for audio data processing included a sub-system for audio data compression comprising: an analog to digital converter converting analog audio signals into digital audio signals; a non-segment-based multi-channel splitter splitting digital audio signals into multiple channels without segmenting signals in each of the multiple channels; a plurality groups of 1D discrete wavelet transformers, each of the groups including a predetermined number of 1D discrete wavelet transformers which discrete wavelet transform for a respective one of the multiple channels split signals thereof and through the predetermined number of filtering levels into wavelet coefficients; a plurality of quantizers each of which quantizes for the respective channel the wavelet coefficients thereof; a multiplexer multiplexing quantized wavelet coefficients of the multiple channels into one data stream and segmenting the data stream into segments; and an embedded block coder coding the segments into a plurality of code blocks, discarding some of the code blocks, truncating a bit stream embedded in each of the remaining code blocks, and stringing the truncated bit stream embedded in each of the remaining code blocks into a compressed data stream.

According to another aspect of the invention, the system for audio data processing further includes a sub-system for audio data de-compression comprising: an embedded block decoder decoding the compressed data stream to provide a plurality of 2-D arrays containing decoded wavelet coefficients in segments; a de-multiplexer de-multiplexing the decoded wavelet coefficients into the multiple channels without segments; a plurality of de-quantizers each of which de-quantizes for a respective one of the multiple channels the decoded wavelet coefficients thereof into de-quantized wavelet coefficients in different levels; a plurality groups of 1D inverse discrete wavelet transformers, each of the groups including a predetermined number of 1D inverse discrete wavelet transformers each of which inversely discrete wavelet transforms for the respective channel the de-quantized wavelet coefficients in different levels into digital audio data; a non-segment-based multi-channel mixer mixing the digital audio data of the multiple channels into a stream of digital audio data; and a digital to analog converter converting the digital audio data into analog audio signals.

BRIEF DESCRIPTION OF THE DRAWINGS

The advantages of the present invention will become apparent to one of ordinary skill in the art when the following description of the preferred embodiments of the invention is taken into consideration with accompanying drawings where like numerals refer to like or equivalent parts and in which:

FIG. 11 shows neighbors states for forming the context according to the priori art;

FIG. 12 shows an example of sub-bit plane order of EBCOT according to the priori art;

DETAILED DESCRIPTION OF THE PREFERRED EMBODIMENTS

Figure 1:
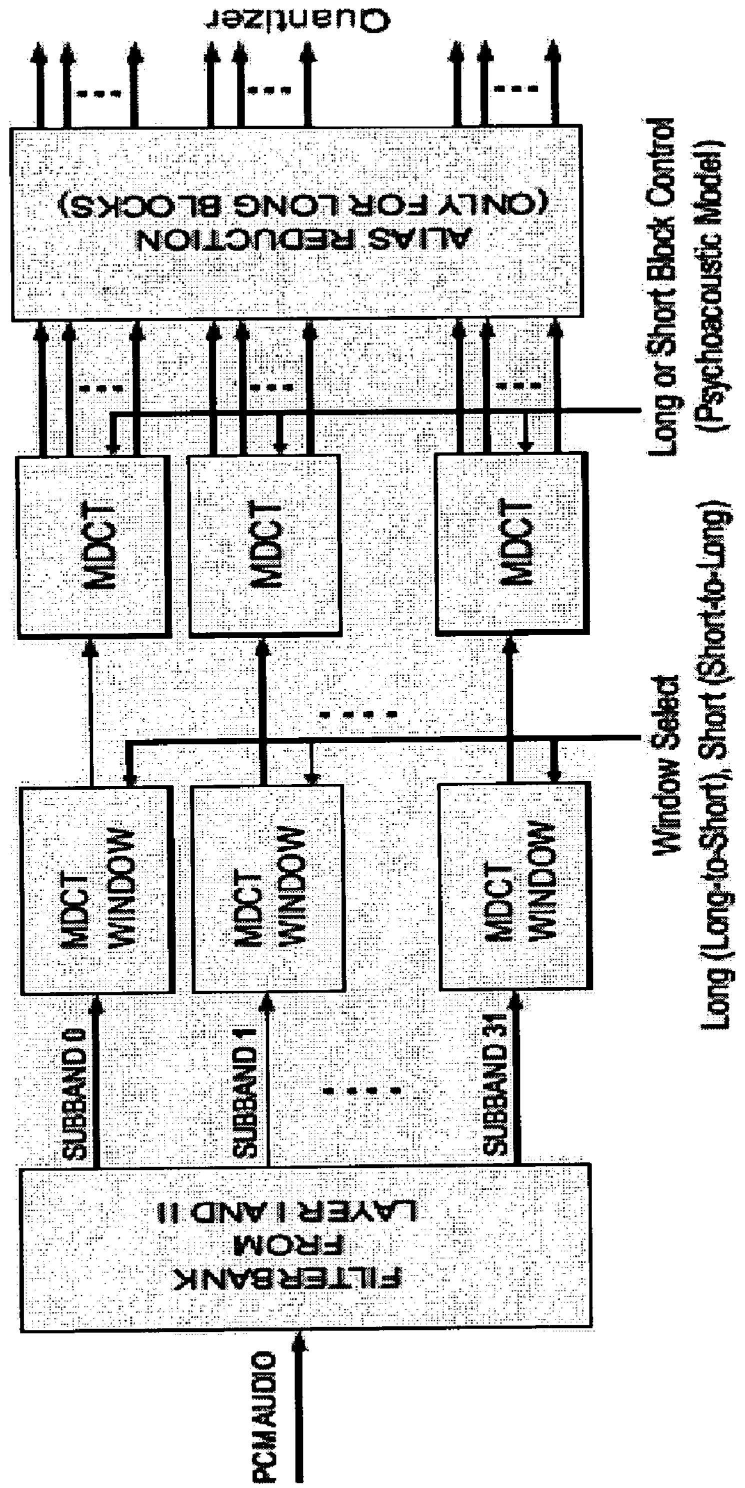
FIG. 1 shows a MPEG-1/Audio Layer III filter bank processing at the encoder side according to the prior art.

With reference to the figures, like reference characters will be used to indicate like elements throughout the several embodiments and views thereof.

Segment-based Channel Splitting Scheme

Figure 2:
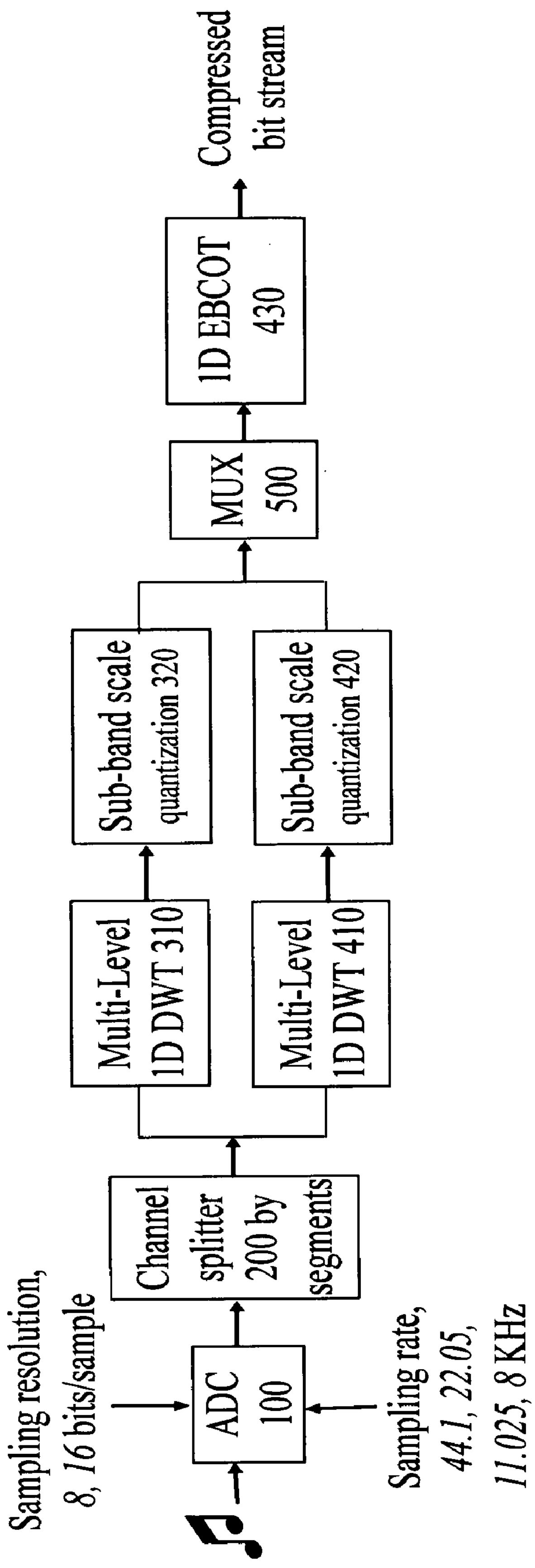
FIG. 2 is a Functional Block Diagram of audio compression using the segment-base channel splitting scheme according to the invention.
Figure 3A:
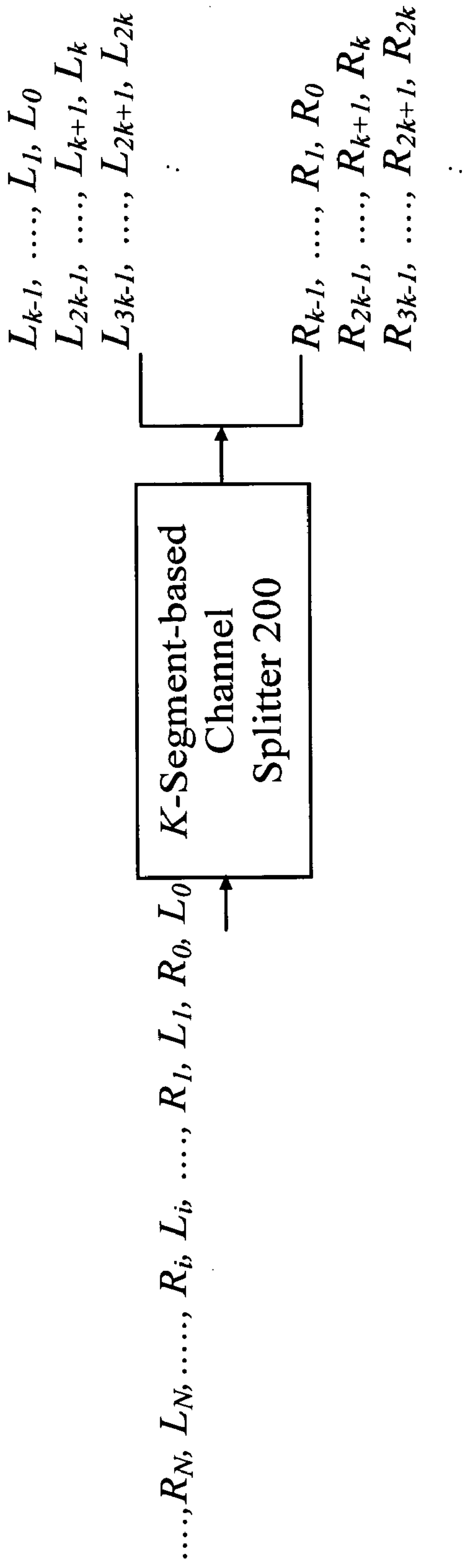
FIG. 3A shows the Segment-based Channel Splitter in FIG. 2.
Figure 3B:
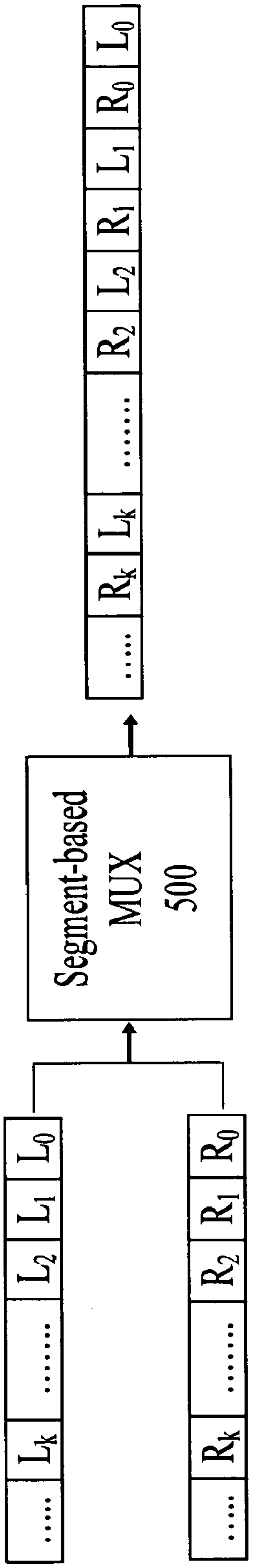
FIG. 3B shows the Segment-based MUX in FIG. 2.

Under a segment-based channel splitting scheme 1000 of the invention as depicted in FIG. 2, analog audio signals are digitalized by an analog to digital converter (ADC) 100, in which the sampling resolution may be set as 8 or 16 bits per sample, and the sampling rate may be set as 44.1, 22.05, 11.025, or 8 KHz (samples/second) for various applications. For processing stereo audio, a channel splitter 200 is used to separate the stereo audio signal segments to pass through either a right channel or a left channel. A stereo audio signal is digitalized in as a sequence as an incoming signal X (. . . . Lk, Rk, . . . L2, R2, L1, R1, L0, R0, where k is the timing index). Every single segment contains $N=p2^k$ samples, where p is a non-negative integer, and k is the number of levels in the DWT. The channel splitting operation of the segment-based channel splitter 200 is further illustrated in FIG. 3A. Thereafter, they were separated in two streams XL (. . . . Lk, . . . . L2, L1, L0), and XR (. . . . Rk, . . . . R2, R1, R0) for parallel DWT processing via two independent channels. Meanwhile, the two streams XL and XR are also segmented into {(L3k−1. . . . L2k+1, L2k), . . . (L2k−k. . . . Lk+1, Lk), (Lk−1. . . L1, L0)}, and XR {(R3k−1. . . . R2k+1, R2k), . . . (R2k−k. . . . Rk+1, Rk), (Rk−1. . . R1, R0)} by the segment-based channel splitter 200. Once two independent WT operations are complete, two channels of the wavelet coefficients $WL_{N-1}$, . . . , $WL_i$, . . . , $WL_1$, $WL_{0,\ and}$ $WR_{N-1}$, . . . , $WR_i$, . . . , $WR_1$, $WR_0$ are quantized and merged into a single data sequence . . . $QR_1$, $QL_1$, $QR_0$, $QL_0$, in MUX 500, which is further depicted in FIG. 3B. The result of MUX 500 is a bit stream of compression data. The left and right channels are used as an example. In another embodiment, the an incoming signal X are split into four or more channels corresponding the multi-channel surround sound to create a sound field that envelops the user and recreate a theater environment.

Discrete Wavelet Transform:

1-D DWT processing of the invention is described in terms of a set of filter bank, wherein an input signal is analyzed in both low and high frequency bands. The application of a filter bank comprising two filters, gives rise to an analysis in two frequency bands: low pass and high pass filtering. A high pass filter allows high frequency components to pass through, suppressing low frequency components. A low pass filter does the opposite: it allows the low frequency parts of the signal to pass through while removing the high frequency components. Each resulting band is then encoded according to its own statistics for transmission from a coding station to a receiving station. If the processed data is huge, the more the decomposition/lifting levels, the closer the coding efficiently comes to some optimum point until it levels off because other adverse factors become significant. Hardware constraints limit how filters can be designed and/or selected. The constraints include the desire for perfect output reconstruction, the finite-length of the filters, and a regularity requirement that the iterated low pass filters involve convergence to continuous functions.

Figure 4:
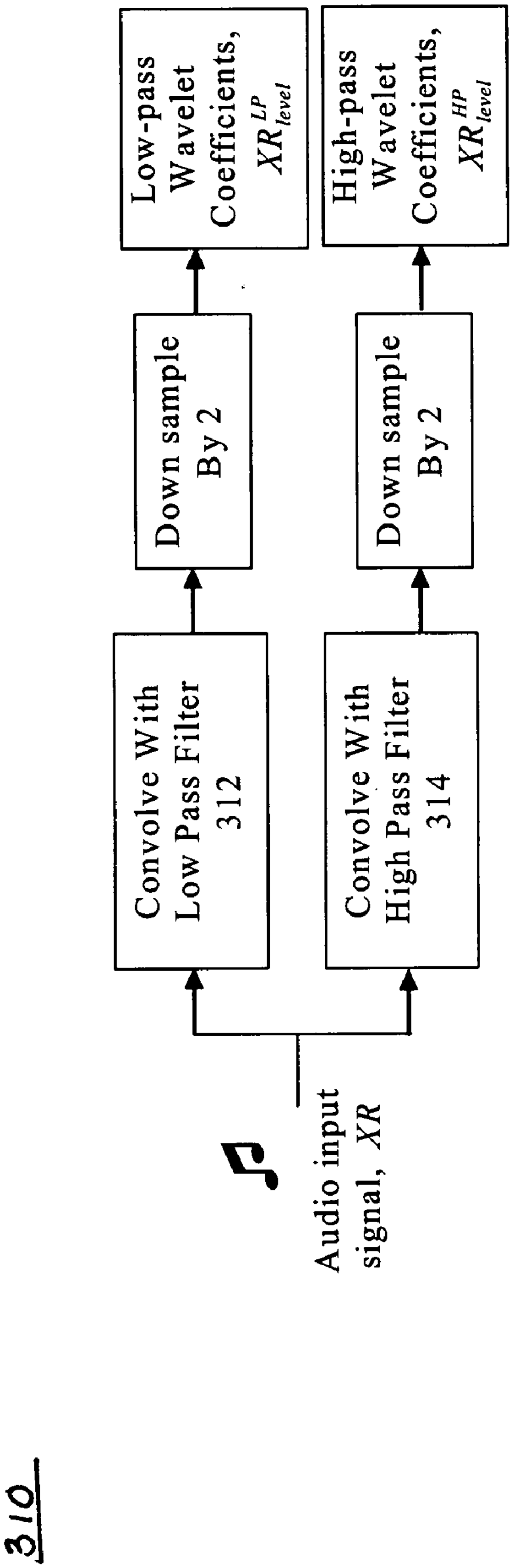
FIG. 4 shows the One-dimensional Forward Discrete Wavelet Transform 310 in FIG. 2.
Figure 5A:
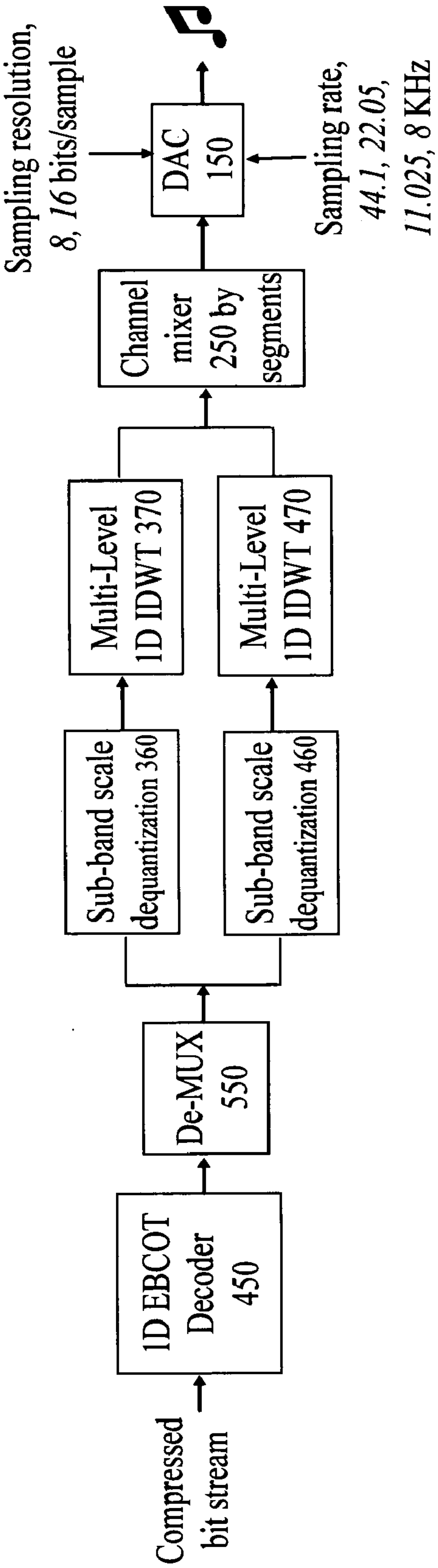
FIG. 5A is a Functional Block Diagram of audio de-compression using the segment-base channel splitting scheme according to the invention.
Figure 5B:
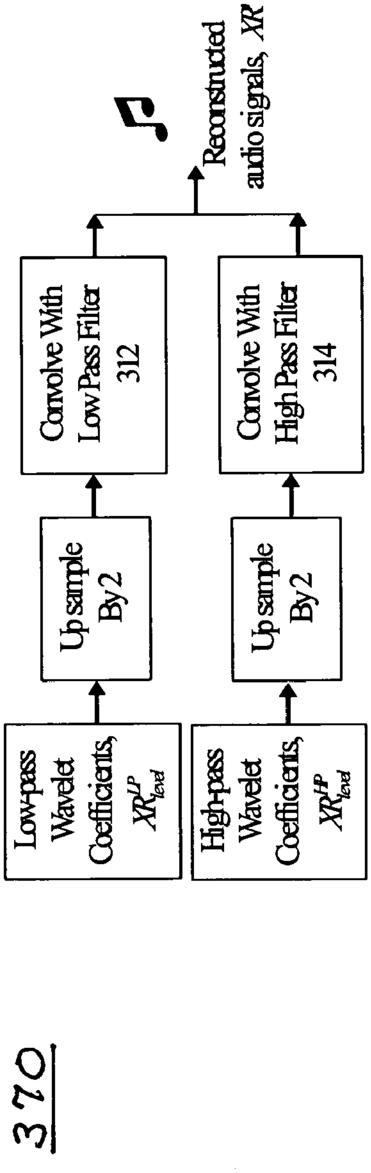
FIG. 5B shows the one-dimensional Inverse Discrete Wavelet Transform in FIG. 5A.

To perform the WT, each of the multi-level 1D DWT 310, 410 uses a one-dimensional subband decomposition of a one-dimensional array of samples XL or XR into low-pass coefficients, representing a down-sampled low-resolution version of the original array, and high-pass coefficients, representing a down-sampled residual version of the original array, necessary to perfectly reconstruct the original array from the low pass array. Two 1-D DWTs 310, 410 hierarchically decompose the input signals XL and XR respectively into a series of successively lower resolution reference signals and their associated detail signals. As shown in FIG. 4, a low pass filter 312 and a high pass filter 314 are used at each resolution level to decompose the input signal XR and the subsequent decomposed signals into two groups of sub-band coefficients $XR_{level}^{LP}$, $XR_{level}^{HP}$. The two sub-bands are filtered and down-sampled version of the original of samples, where level is the level of the sub-band decomposition. LP and HP represent the low-pass and high-pass results respectively. $XR_{level}^{LP}$ represents the transform coefficients obtained from low-pass filtering. $XR_{level}^{HP}$ represents the transform coefficients obtained from high-pass filtering. Multiple levels of 1-DWT is performed for each channel by using only one single 1-DWT to the low-pass transformed coefficients recursively to save circuitry. However, the resulted signals have the problem of discontinuous boundaries. Inverse DWT (IDWT) is processed backwards. The reference signals and detailed signals contain the information necessary for reconstructing back to the next highest resolution level. Up-sampling is inserting a zero in between every two samples. As such, the filters perform a lot of multiplications by zero. FIG. 5A illustrates a audio data de-compression operation using the segment-base channel splitting scheme according to the invention. The de-compression operation basically reverses the operation of the compression as discussed above. FIG. 5B shows the one-dimensional Inverse Discrete Wavelet Transform in FIG. 5A, which is a reverse processing of the one shown in FIG. 4.

Figure 6:
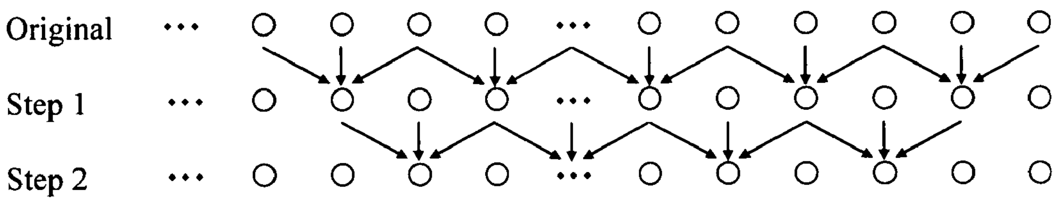
FIG. 6 shows a Two-step lifting WT according to the invention.

Lifting Wavelet is a space-domain construction of biorthogonal wavelets developed by WIm Swelden, which consists of the iterations of three basic operations: split, predict, and update. The split step divides the original data into two disjoint subsets. For example, the original data set x[n] can be split into $x_e[n]=x[2n]$ for the even indexed points, and $x_0[n]=x[2n+1]$ for the odd indexed points, where n is a non-negative integer. The predict step is to predict the difference of wavelet coefficients. For example, the difference of wavelet coefficients, d[n], can be predicted as $d[n]=x_e[n]-P(x_0[n])$, where P is some prediction operator. The update step is to obtain scaling coefficients c[n] by combining $x_e[n]$ and d[n]. For example, the scaling coefficients, c[n], can be updated as $c[n]=x_e[n]+U(d[n])$, where U is an update operator. FIG. 6 illustrates the 2-step lift wavelet transforms. The lifting scheme leads to a fast in-place calculation of the wavelet transform that does not require auxiliary memory. The lifting scheme can be easily modified to implement integer reversible wavelet transform (IRWT) that maps integers to integers. Namely, the IRWT provides the decomposition of original signal into a set of integer coefficients. Since it allows perfect reconstruction, by inverse transform of IRWT the original signal can be reconstructed without any loss. Practically, non-integer transforms expand the input data (for example, 16 bit audio signal) to 32 bit wide floating point numbers in order to describe the real numbers of their coefficients. During the quantization or rounding process of these real numbers to low bit integers in a compression system, some corresponding information is lost and thus can not reconstruct the original signal from the decoder side of the system. From a lossless compression point of view, it is thus very important that IRWT coefficients consist of the integers and have same dynamical range as the input signal. These discharge some from the consideration regarding the size of the variables to be used and the designing fast algorithms. The memory utilization of integers is also a positive consideration. It means that whatever deterministic rounding operation is used, the integer lifting scheme is always reversible. Of course, the resulting system is nonlinear, and the new subband signals serve only to approximate the original subband signals. The result is a collection of sub-bands which represent several approximation scales. A sub-band is a set of coefficients, which represent aspects of the audio signal associated with a certain frequency range.

In a preferred embodiment, the invention applies 3 and 5 tap integer lifting WT. The implementation of the lift WT includes the coefficient wrapping to prevent the boundary effects. The 3 and 5 tap integer lifting WT uses lifting-based filtering in conjunction with rounding operations. The forward operation is described as follows (X: input signal, Y: output signal):

$$Y_i = X_i - \text{floor}((X_{i-1} + X_{i+1})/2);\ i \text{ is an odd number} \quad (1)$$

$$Y_i = X_i + \text{floor}((Y_{i-1} + Y_{i+1} + 2)/4);\ i \text{ is an event number} \quad (2)$$

The IDWT is implemented by operating the DWT backwards, i.e., the inverse transform is a mirror operation of the forward transform. An up-sampling operation is used in the IDWT instead of the down-sampling operation used in DWT. Before the WT coefficients are transmitted, the values close to zero (most of them are the high frequency data) may be eliminated. The inverse transform is conducted by first performing an up-sampling step and then to use two synthesis filters (low-pass) and (high-pass) to reconstruct the signal. The filters are necessary for smoothing because the up-sampling step is done by inserting a zero in between every two samples. The inverse operation is described as follows:

$$X_i = Y_i - \text{floor}((Y_{i-1} + Y_{i+1} + 2)/4);\ i \text{ is an event number} \quad (3)$$

$$X_i = Y_i - \text{floor}((X_{i-1} + X_{i+1})/2);\ i \text{ is an odd number} \quad (4)$$

Sub-band Scale Quantization

A purpose for quantization is to reduce in precision of subband coefficients so that fewer bits will be needed to encode the transformed coefficients. These subband coefficients are scalar-quantized, giving a set of integer numbers which have to be encoded bit-by-bit. In digital signal processing, quantization is the process of approximating a continuous signal by a set of discrete symbols or integer values. Choosing how to map the continuous signal to a discrete one depends on the application. For low distortion and high quality reconstruction, the quantizer must be constructed in such a way to take advantage of the signal's characteristics.

Quantizing wavelet coefficients for audio compression requires a compromise between low signal distortion and compression efficiency. It is the probability distribution of the wavelet coefficients that enables such high compression of music.

Figure 7:
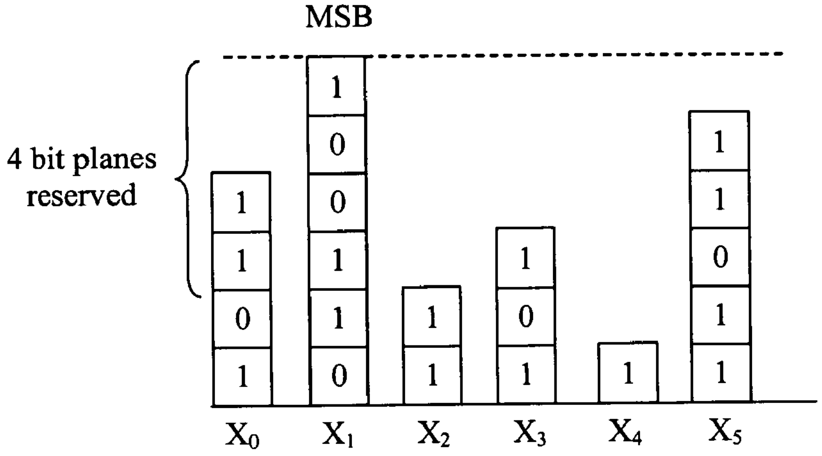
FIG. 7 shows an example of MSBP according to the invention.
Figure 8:
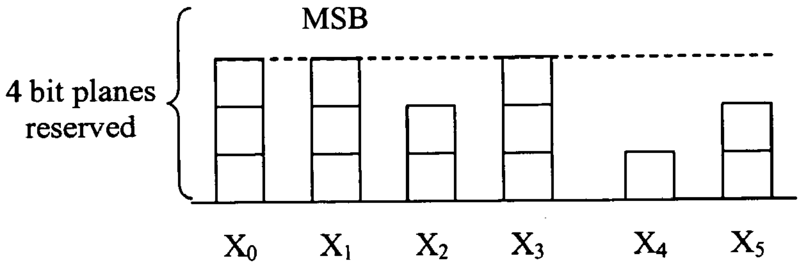
FIG. 8 shows another example of MSBP according to the invention.

This compression algorithm uses most significance bit preserving (MSBP) uniform scalar quantization. Scalar quantization means that each wavelet coefficient is quantized separately, one at a time. Uniform quantization means that the structure of the quantized data is similar to the original data. FIG. 7 demonstrates the MSBP uniform scalar quantization. In MSBP quantization, the max bit plane must be calculated to indicate the max number of bits to represent the entire wavelet coefficient in a code block. MSBP Quantization is operated by preserving certain number of bit plane starting from the MSB. For simplicity, only 6 wavelet coefficients (13, 38, 3, 5, 1, and 27) are considered to be quantized in FIG. 7. MSB is 6 such that 4 bit planes are reserved and 2 bit planes are cut out. The quantized data become 3, 9, 0, 1, 0, and 6 respectively. (The de-quantized data, after inserting two least significance bit planes with zeros, become 12, 36, 0, 4, 0, and 24 respectively.) As another example, if the number of bit to preserve is greater than the MSB, none of the bit plane will be cut out. FIG. 8 illustrates that MSB is 3 and 4 bit planes are preserved. All 3 bit planes will be coded. This MSBP mechanism is employed to compress the signals from the most significance data to the least ones under a particular bit rate.

Figure 9:
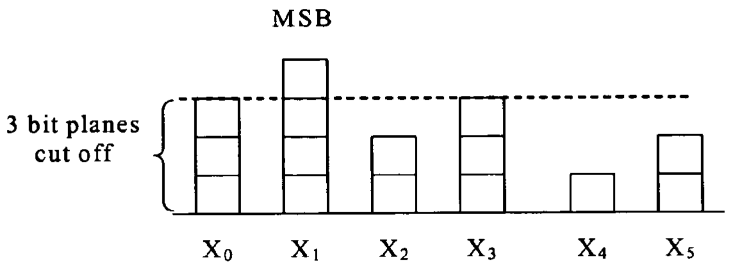
Fig. 9 Prior Art
FIG. 9 shows a prior art quantization technique.

On the other hand, the prior art quantization technique tries to preserve property of the data by cutting off a fixed number of bit planes from the bottom as shown in FIG. 9 based upon a perceptual masking threshold, regardless the MSB, as disclosed in an article titled "Perceptual Zerotrees For Scalable Wavelet: Coding Of Wideband Audio" by Aggarwal et al. Another article titled "Wideband Speech And Audio Coding Based On Wavelet Transform And Psychoacoustic Model" by He et. al. normalizes wavelet coefficients with a uniform zero-symmetric quantizer.

Embedded Block Coding with Optimized Truncation (EBCOT)

Figure 10:
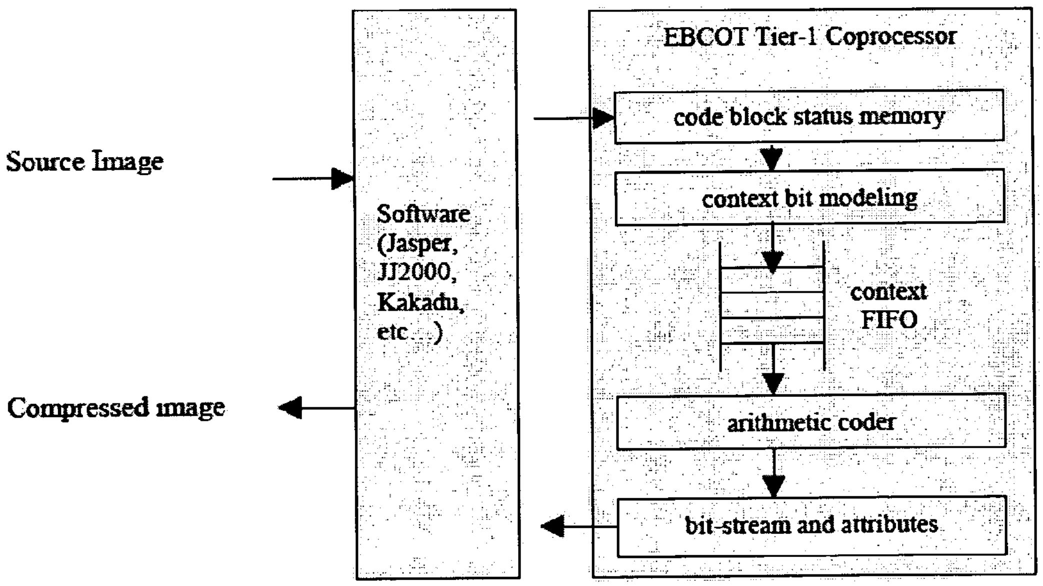
FIG. 10 shows a JPEG2000 co-processing architecture.

The EBCOT scheme became the ISO international standard of still image compression ISO/IEC 15444 due to its superior performance in term of coding efficiency and functionality features, such as scalability and random access, as compared to other known techniques. A key advantage of scalable compression is that the target bit-rate or reconstruction resolution need not be known at the time of compression. A related advantage is that the image need not be compressed multiple times in order to achieve a target bit-rate. Rather than focusing on generating a single scalable bit-stream to represent the entire image, EBCOT partitions each subband into relatively small blocks of samples and generates a separate highly scalable bit-stream to represent each so-called code block. However, DWT and EBCOT are computationally intensive and require a significant number of memory access. FIG. 10 shows the JPEG2000 co-processing architecture. An image is first processed by DWT, and then wavelet sub-band coefficients will be obtained. The operation of EBCOT is to divide each sub-band into several non-overlapping code blocks. Each block is then entropy encoded entirely and independently, and a separate bit stream is generated by using the bit-plane context arithmetic coding.

Code-blocks are located in a single sub-band and have equal sizes. The bits of all quantized coefficients of a code-block are encoded, starting with the most significant bits and progressing to less significant bits. Code block data produced by the software implementation of the JPEG2000 codec is stored in the code block status memory. The context bit model reads the block status data, including sign and magnitude bits, from the memory block stripe by stripe (a stripe is 4 consecutive rows of pixel bits in a code block bit-plane). Within a stripe, samples are scanned column by column. “Context bit modeling” uses bit-wise processing to scan over the code block, and generates contexts according to the wavelet coefficients. It is also known as a bit-plane coder.

Figure 17:
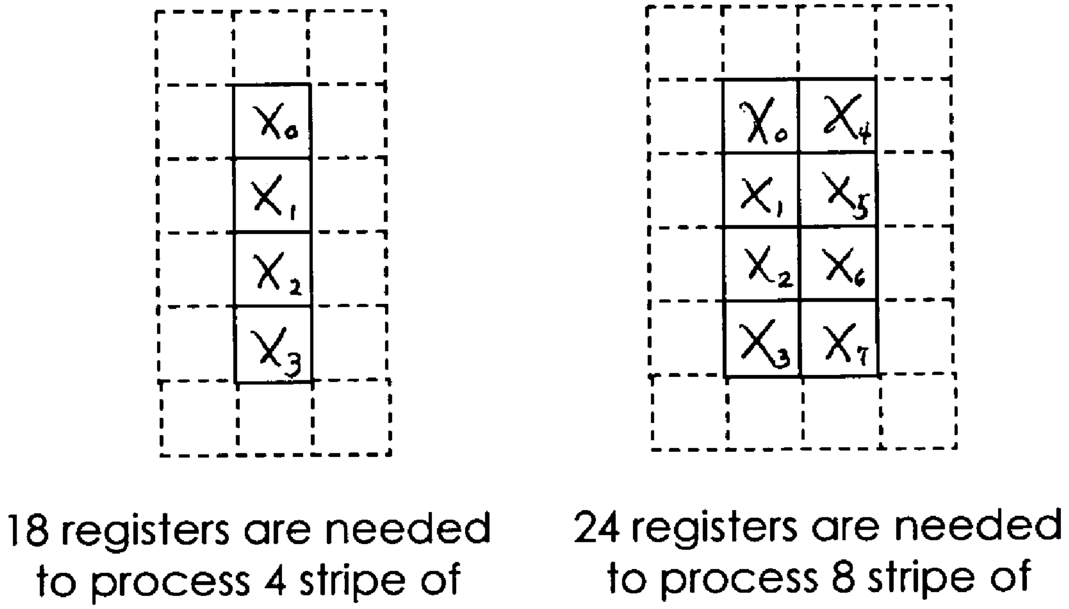
FIG. 17 illustrates a method of RAM encryption to increase the throughput according to the invention.

In this encoding process, each bit-plane of the code block gets encoded in three coding passes, first encoding bits (and signs) of insignificant coefficients with significant neighbors (i.e. with 1-bits in higher bit-planes), then refinement bits of significant coefficients, and finally coefficients without significant neighbors. The three passes are called Significance Propagation, Magnitude Refinement and Cleanup Pass, respectively. Each coefficient bit is coded in exactly one of the three coding passes. Which pass a coefficient bit is coded in depends on the conditions for that pass. Each of three passes outputs a series of binary symbols, and these symbols are entropy coded using arithmetic coding. Each context generation for each bit “x” needs to reference its 8 neighboring bits “D0,” “V0,” “D1,” “H1,” “D3,” “V1,” “D2,” and “H0” in the bit-plane shown in FIG. 11. Thus, significant memory and storage bandwidth is required in the bit-plane coder. Three states for each coefficient are maintained for three-pass context bit model. The parallelism can be achieved by checking all 4 or 8 samples of a column concurrently as shown in FIG. 17 to reduce the average number of memory access within a coding pass. FIG. 17 illustrates two examples of the invention of the encrypted RAM to reduce the memory access time and increase the throughput. In the prior art, 9 data are retrieved from the memory with 9 clocks of memory access time for processing each data such that it takes 4*9=36 clocks of memory access time for processing 4 data x0, x1, x2, and x3. However, according to the invention as shown in the left side of FIG. 17, 18 data are retrieved from the memory with 18 (<36) clocks of memory access time, and then stored in 18 registers for processing 4 sample.

As another example, in the prior art, it takes 8*9=72 clocks of memory access time for processing 8 data x0, x1, x2, x3, x4, x5, x5, and x7. However, according to the invention as shown in the right side of FIG. 17, 24 data are retrieved from the memory with 24 (<72) clocks of memory access time, and then stored in 24 registers for processing 8 sample. Since the three coding passes need all eight connected-neighbor data, a 4×N stripe (which is a part of the standard of EBCOT; however, 5×N or 8×N or other arbitary number×N may be used for special needs) of core bit-plane process is designed to perform the three coding passes simultaneously. Additionally, an encrypted RAM is designed to reduce the redundant operations in the boundary situations. Because independent relationship exists between the three coding passes, it also makes possible parallel processing of different coding passes.

FIG. 12 shows the example of sub-bit plane order of EBCOT. The details explanation is available in ISO/IEC JTC1/SC29/WG1/N1646R, *JPEG* 2000 Part I Final Committee Draft Version 1.0, Mar. 2000, which is hereby incorporated by reference. The bits selected by these coding passes then get encoded by a context-driven binary arithmetic codec, namely the binary MQ-coder. It compresses quantized wavelet coefficients into a bit-scream using context/data pair from bit modeling. The primary advantage of the MQ coder is that the probabilities associated with LPS (Less Probable Symbol) and MPS (More Probable Symbol) can be adopted. For every context label, there is a corresponding state machine associated with it. The context from bit modeling is used to index into a look-up table of LPS probability value (Qe). The compressed bit-stream obtained during arithmetic coding is provided to the bit-stream memory. It allows the software implementation to perform post-processing on the bit-stream until the whole compression process is finished.

The context of a coefficient is formed by the state of its eight neighbors in the code block. The result is a bit-stream that is split into packets where a packet groups selected passes of all code blocks from a precinct into one indivisible unit. Packets are the key to quality scalability (i.e. packets containing less significant bits can be discarded to achieve lower bit-rates and higher distortion). Packets from all sub-bands are then collected in so-called layers. The way how the packets are built up from the code-block coding passes, and thus which packets a layer shall contain is not defined by the JPEG2000 standard, but in general a codec will try to built layers in such a way that the image quality will increase monotonically with each layer, and the image distortion will shrink from layer to layer. Thus, layers define the progression by image quality within the code stream.

Once the entire image is compressed, a post-processing operation passes all compressed code blocks and determines the extent to which the embedded bit stream for a code block should be truncated in order to achieve a particular target bit rate, a distortion bound, or other quality metric. The bit-stream associated with the code block may be independently truncated to any of a collection of different lengths. These truncations result in the increase in reconstructed image distortion with respect to an appropriate distortion metric. The enabling observation leading to the development of the EBCOT algorithm is that it is possible to independently compress relatively small blocks (say 32×32 or 64×64) with an embedded bit-stream consisting of a large number of truncation points. The existence of a large number of independent code-blocks, each with many useful truncation points leads to a vast array of options for constructing scalable bit-streams.

To efficiently utilize this flexibility, the EBCOT algorithm introduces an abstraction between the massive number of code-stream segments produced by the block entropy coding process and the structure of the bit-stream itself Specifically, the bit stream is organized into so-called quality layers. One or more of the subbands may be discarded to reduce the effective image resolution, and some of the code blocks may be discarded to reduce the spatial region of interest. The final bit stream is obtained by stringing blocks together in any predefined order. The bit stream can be signal noise ratio (SNR) as well as resolution scalable.

Figure 13:
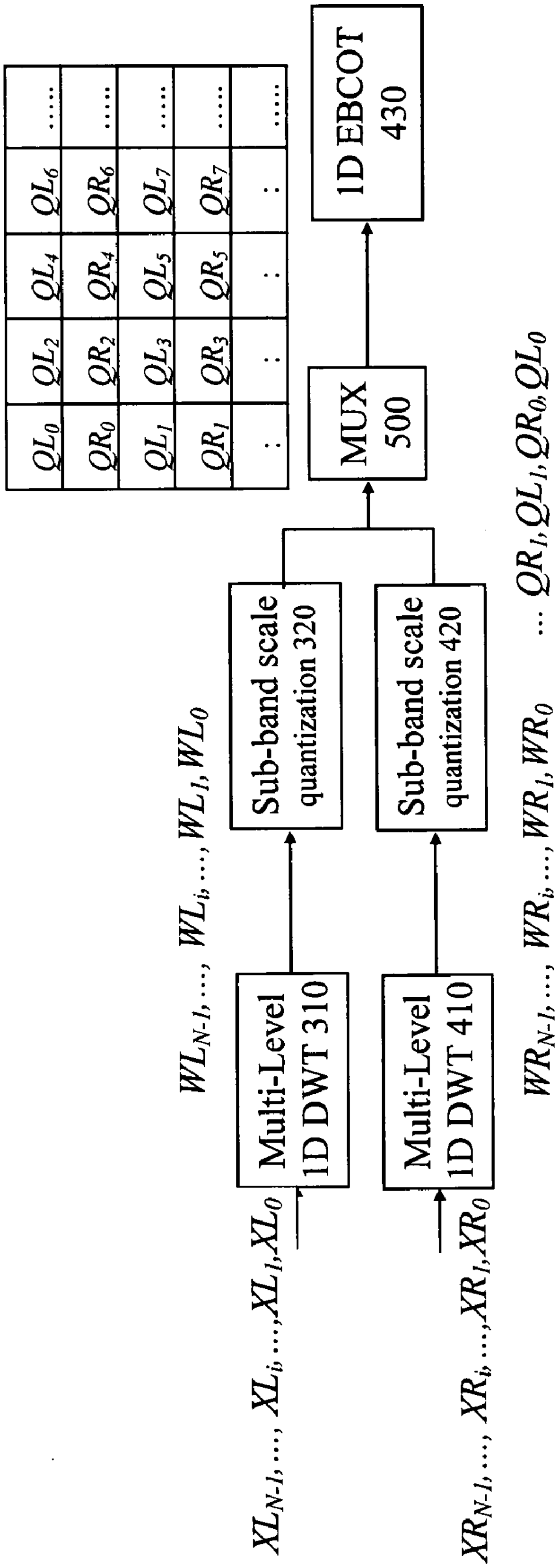
FIG. 13 is a block diagram of audio compression using EBCOT according to the invention.

The prior art EBCOT scheme is designed for image and video compression. The invention provides a specific sequence of EBOCT coding for audio compression. The audio compression of the invention applies a modified EBCOT to provide good audio quality. It is also applicable to video compression applications for the cost reduction since the audio and video processings can share the same circuitry of EBCOT. It is also significant to solve the audio synchronization for video applications when using the EBCOT within the same circuitry. FIG. 13 shows the block diagram of the modified EBCOT according to the invention.

The 1-dimensional wavelet sub-band coefficients of stereo channels is composed into a plurality of two dimensional arrays shown in FIG. 13, and then each array is processed using EBCOT in FIG. 12. The 2-D array can be one a size of 30 (row)*45 (column). The EBCOT design of the invention supports a method, system, mechanism, and system for providing a high-speed, low-power, compact, high-quality, versatile, and controllable EBCOT scheme. Technically, there are several difficulties in the implementation of EBCOT. First of all, it is challenging to have EBCOT operate at a consistent throughput, since EBCOT is extremely time consuming due to its bit-plane compression based on the statistical analysis. Secondly, EBCOT requests a great number of memory access because the data context is formed based upon the neighbors' states of a single bit plane. And every single bit in each bit plane requires one clock of memory access time, since the memory access is based on the unit of bytes. Next, EBCOT needs 9 registers at least to process for one single data context, which implies one bit data context is processed within 9 clocks of memory access time plus several clocks for the data processing. High rate of memory access uses a lot of power. These technical difficulties make the implementation of real-world applications extremely difficult.

The innovative EBCOT implementation of three coding passes according to the invention includes the design of a dual-buffered memory, a rolling dice memory architecture, and an OR bitmax finder.

Figure 14:
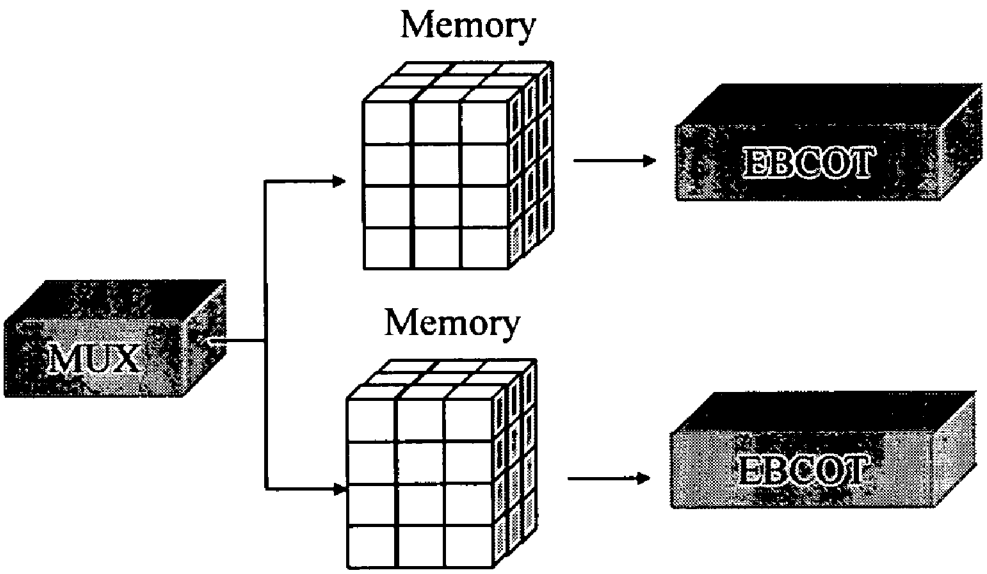
FIG. 14 shows a dual-buffer pipelined structure according to the invention.

The EBCOT device of the invention uses a multiple-buffer pipelined structure (the dual-buffer is used as an example) to increase the throughput. The size and resolution of the working template memory are adaptively assigned based on the need of the process of code blocks and the dynamic range of the wavelet transform of components, such as left, right, etc. This dual-buffer pipelined structure is designed to ping pong the process of taking in the quantized wavelet coefficients using EBCOT by segments. While one buffer is taking a segment, the other buffer is allocating for next segment of coefficients to take in so as to maintain the consistent throughput for real-time applications. FIG. 14 demonstrates the dual-buffer pipelined structure.

Figure 15:
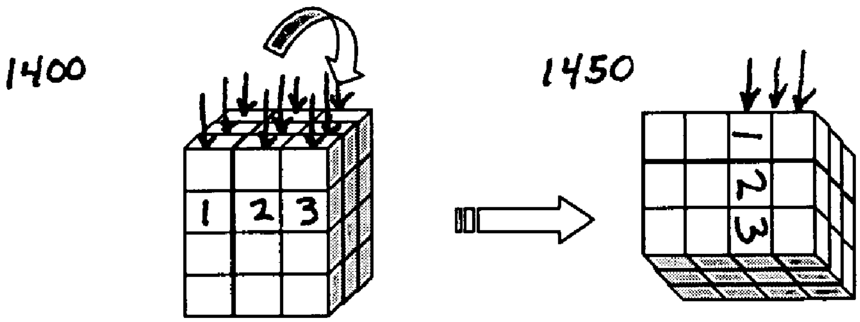
FIG. 15 shows the fundamental operation of the rolling-dice memory according to the invention.

The mechanism of the rolling dice memory of the invention provides the bit-plane data without the prior art delay and extra hardware cost. FIG. 15 shows the fundamental operation of the rolling dice memory. In the prior art (shown in the left side of FIG. 15), data is accessed by bytes (8, or 16 bits). For example, in order to retrieve data "1," "2," "3," "4," "5," "6," "7," "8" and "9" in the second bit plane form the top, the priori art accesses the memory 9 times, and each time retrieves 4 data including only one interested datum, e.g., "1". The prior art needs 9 clocks of data accessing time for only one bit operation which is not appropriate and efficient for bit-plane operation. The rolling dice memory mechanism (shown in the right side of FIG. 15) rotates the cubic memory to different orientation such that it can perform the bit-plane operation effectively by accessing the memory only 3 times, and each time retrieves 3 data including only interested data, e.g., "1," "2," and "3". The rotation of the cubic memory can be implemented through moving the data to new physical addresses, or mapping the addresses with the new orientation for retrieving data.

Figure 16:
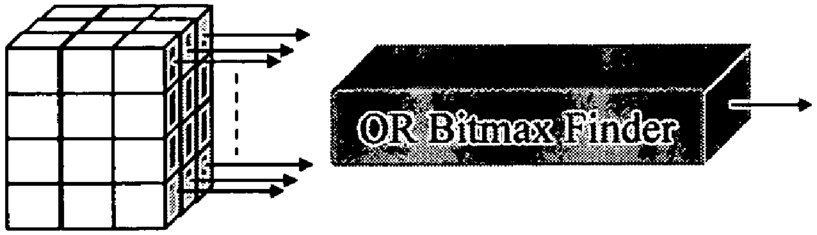
FIG. 16 shows one embodiment of the OR Bitmax Finder according to the invention.

The EBCOT algorithm in JPEG2000 must determine the maximum number of bits for the code block, in which this information is needed for the decoder to reconstruct the image. OR-Bitmax finder is the device using a simple logic OR circuit to keep the maximum number of bits for the processed data so far. An OR-Bitmax finder of the invention is declared as a number of bits of a logic OR circuit. This logic is recursively ORed by the next data. And the maximum number of bits is determined by counting bits starting on the first non-zero bit from the MSB. FIG. 16 depicts the efficient way to identify the first non-zero bit plane from the MSB. The sign process in the significant pass or the cleanup pass has three different operations respectively for zero, positive values, and negative values. These three cases need two bits to represent such that the cost of the circuit implementation is high. The 1-bit sign process in this invention reduces the operations from three to two. This mechanism reduces the need of the memory for sign bits and enhances the performance.

Non-segment-based No-latency Scheme

Figure 18:
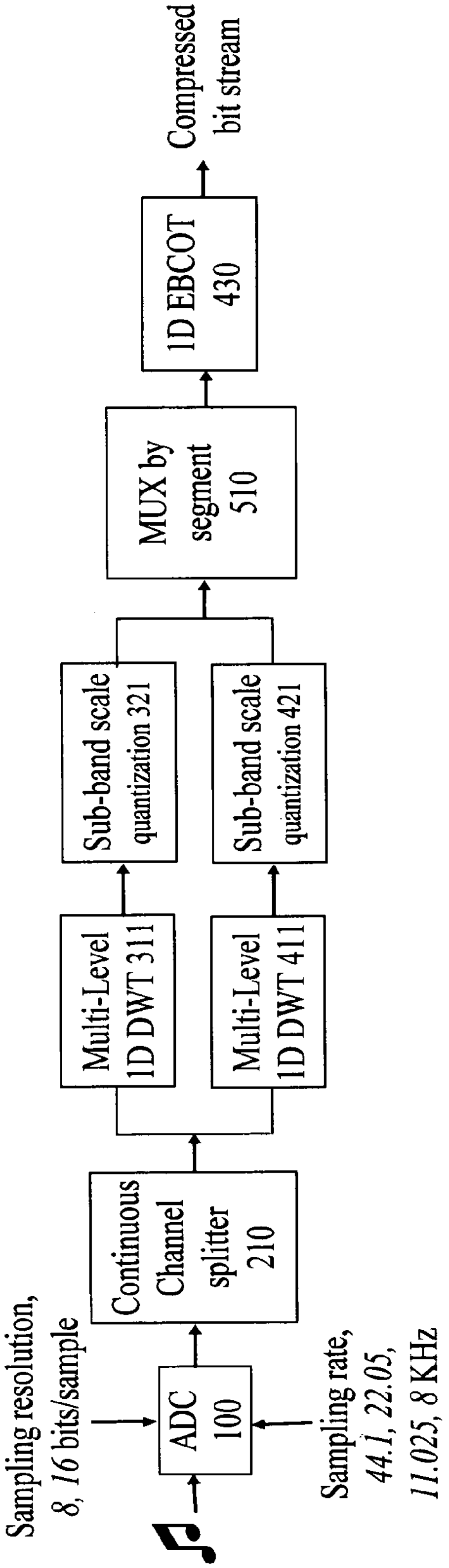
FIG. 18 is a functional block diagram of audio compression using non-segment-base audio compression according to the invention.
Figure 19:
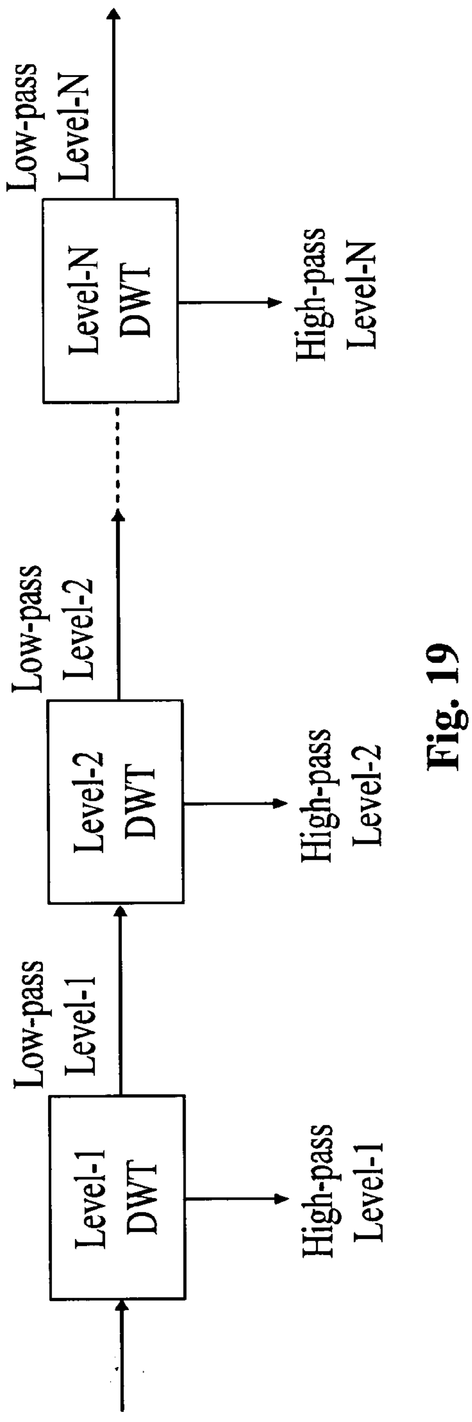
FIG. 19 shows the Multi-Level 1D DWT for the non-segment based audio compression in FIG. 18.

FIG. 18 shows a structure for non-segment-based no-legacy wavelet transform. In order to eliminate the processing latency, the design of a parallel multi-level (N levels) real-time DWT in FIG. 19 is invented. Contrary to the channel splitter 200 in FIG. 3A, the an incoming signal X ( . . . Lk, Rk, . . . L2, R2, L1, R1, L0, R0, where k is the timing index) are split in two streams XL ( . . . Lk, . . . L2, L1, L0), and XR ( . . . Rk, . . . R2, R1, R0) but not segmented by the channel splitter 210. The sample signals are continuously fed into the parallel multi-level real-time DWT 311, 411 without segmentation. The left and right channels are used as an example. In another embodiment, the an incoming signal X are split into four or more channels corresponding the multi-channel surround sound to create a sound field that envelops the user and recreate a theater environment.

For processing stereo audio, a channel splitter 200 is used to separate the stereo audio signal segments to pass through either a right channel or a left channel. A stereo audio signal is digitalized in as a sequence as an incoming signal X ( . . . Lk, Rk, . . . L2, R2, L1, R1, L0, R0, where k is the timing index). Every single segment contains $N=p2^k$ samples, where p is a non-negative integer, and k is the number of levels in the DWT. The channel splitting operation of the segment-based channel splitter 200 is further illustrated in FIG. 3A. Thereafter, they were separated in two streams XL ( . . . Lk . . . L2, L1, L0), and XR ( . . . Rk, . . . R2, R1, R0) for parallel DWT processing via two independent channels with segmentation as in FIG. 3A. Multiple levels of 1-DWT is performed for each channel by using multiple 1-DWT to the low-pass transformed coefficients recursively to save time, rather than by using only one 1-DWT to save circuitry as in FIG. 2. As such, the resulted signals do not have the problem of discontinuous boundaries. Once two independent WT operations are complete, two channels of the wavelet coefficients are quantized through sub-band scale equalization 321, 421, and then segmented and merged into a single data sequence in MUX 510. The result of MUX 510 is a bit stream of compression data.

Compared with the priori art shown in FIG. 1, the embodiments of the invention shown in FIG. 2 and FIG. 18 do not suffer from latency. In FIG. 1, the MDCT processing requires a computational complexity of $O(n^2)$ operations (where n is the data size), and the psychoacoustic processing requires a $2*O(n^2)$ operations. Either take a lot of time. Worst of all, the frequency analysis requires receiving all to-be-analyzed data (e.g., 1048 bits) then starts processing which created a latency $\Delta t$ of 0.5 second. For example, if A calls B via the priori art scheme, B will not hear A after 0.5 second, then A has to wait for B to finish then reply, which will take another 0.5 second latency. In contrast, the embodiments of the invention process data as soon as they arrive without waiting for other data such that there is no latency.

The principles, preferred embodiments and modes of operation of the present invention have been described in the foregoing specification. However, the invention that is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A system for audio data processing including (1) a sub-system for audio data compression comprising:

an analog to digital converter converting analog audio signals into digital audio signals;

a non-segment-based multi-channel splitter splitting digital audio signals into multiple audio channels without segmenting signals in each of the multiple audio channels;

a plurality groups of 1D discrete wavelet transformers, each of the groups including a predetermined number of 1D discrete wavelet transformers which discrete wavelet transform one-dimensionally for a respective one of the multiple audio channels split signals thereof and through the predetermined number of filtering levels into wavelet coefficients;

a plurality of quantizers each of which quantizes for the respective channel the wavelet coefficients thereof;

a multiplexer multiplexing quantized wavelet coefficients of the multiple audio channels into one data stream and segmenting the data stream into segments; and an embedded block coder coding the segments into a plurality of code blocks, discarding some of the code blocks, truncating a bit stream embedded in each of the remaining code blocks, and stringing the truncated bit stream embedded in each of the remaining code blocks into a compressed data stream, (2) a sub-system for audio data de-compression comprising:

an embedded block decoder decoding the compressed data stream to provide a plurality of 2-D arrays containing decoded wavelet coefficients in segments;

a de-multiplexer de-multiplexing the decoded wavelet coefficients into the multiple audio channels without segments;

a plurality of de-quantizers each of which de-quantizes for a respective one of the multiple audio channels the decoded wavelet coefficients thereof into de-quantized wavelet coefficients in different levels;

a plurality groups of 1D inverse discrete wavelet transformers, each of the groups including a predetermined number of 1D inverse discrete wavelet transformers each of which inversely discrete wavelet transforms one-dimensionally for the respective channel the de-quantized wavelet coefficients in different levels into digital audio data;

a non-segment-based multi-channel mixer mixing the digital audio data of the multiple audio channels into a stream of digital audio data; and a digital to analog converter converting the digital audio data into analog audio signals.

2. The system for audio data processing according to claim 1, wherein each of the de-quantizers de-quantizes for the respective channel the decode wavelet coefficients thereof by inserting a predetermined number of zero bit planes starting from the least significant bit to a detected maximum number of bits in each of the wavelet coefficients.

3. The system for audio data processing according to claim 1, wherein the sub-system for audio data de-compression further comprises multiple buffers and additional embedded block decoders, wherein the multiple buffers operate in turn to locate and take the de-quantized wavelet coefficients from the embedded block coders to the 2-D arrays by segments.

4. The system for audio data processing according to claim 1, wherein the sub-system for audio data de-compression further comprises means for rotating each of the 2D-arrays to a new orientation for bit-plane memory access.

5. The system for audio data processing according to claim 4, wherein said means for rotating maps data addresses in each the 2D-arrays with the new orientation thereby retrieving data therefrom by bit-plane therein.

6. The system for audio data processing according to claim 1, wherein the sub-system for audio data de-compression further comprises RAM, and means for retrieving multiple sample data in a column of each of the code blocks with connected-neighbor data and storing the retrieved data in the RAM.

7. A system for audio data processing including a sub-system for audio data compression comprising:

an analog to digital converter converting analog audio signals into digital audio signals;

a segment-based multi-channel splitter splitting the digital audio signals into multiple audio channels and segmenting split signals in each of the multiple audio channels into a plurality of segments;

a plurality of multi-level 1D discrete wavelet transformers each of which discrete wavelet transforms one-dimensionally for a respective one of the multiple audio channels each of the segments thereof in sequence and recursively through a predetermined number of filtering levels into wavelet coefficients;

a plurality of guantizers each of which quantizes for the respective channel the wavelet coefficients thereof;

a multiplexer multiplexing Quantized wavelet coefficients of the multiple audio channels into a plurality of 2-D arrays;

an embedded block coder coding the 2-D arrays into a plurality of code blocks, discarding some of the code blocks, truncating a bit stream embedded in each of the remaining code blocks, and stringing the truncated bit stream embedded in each of the remaining code blocks into a compressed data stream;

RAM; and means for retrieving multiple sample data in at least three columns of each of the code blocks with connected-neighbor data and storing the retrieved data in the RAM.

8. A system for audio data processing including (1) a sub-system for audio data compression comprising:

an analog to digital converter converting analog audio signals into digital audio signals;

a segment-based multi-channel splitter splitting the digital audio signals into multiple audio channels and segmenting split signals in each of the multiple audio channels into a plurality of segments;

a plurality of multi-level 1D discrete wavelet transformers each of which discrete wavelet transforms one-dimensionally for a respective one of the multiple audio channels each of the segments thereof in sequence and recursively through a predetermined number of filtering levels into wavelet coefficients;

a plurality of quantizers each of which quantizes for the respective channel the wavelet coefficients thereof;

a multiplexer multiplexing quantized wavelet coefficients of the multiple audio channels into a plurality of 2-D arrays; and an embedded block coder coding the 2-D arrays into a plurality of code blocks, discarding some of the code blocks, truncating a bit stream embedded in each of the remaining code blocks, and stringing the truncated bit stream embedded in each of the remaining code blocks into a compressed data stream, (2) a sub-system for audio data de-compression comprising:

an embedded block decoder decoding the compressed data stream to provide a plurality of 2-D arrays containing wavelet coefficients in segments;

a de-multiplexer de-multiplexing the wavelet coefficients of the 2-D arrays into the multiple audio channels;

a plurality of de-quantizers each of which de-quantizes for a respective one of the multiple audio channels the decoded wavelet coefficients thereof into de-quantized wavelet coefficients in different levels;

a plurality of multi-level 1-D inverse discrete wavelet transformers each of which inversely discrete wavelet transforms one-dimensionally for the respective channel the de-quantized wavelet coefficients in different levels in each of the segments thereof in sequence into digital audio data in segments;

a segment-based multi-channel mixer mixing the digital audio data in segments of the multiple audio channels into a stream of digital audio data; and a digital to analog converter converting the digital audio data into analog audio signals.

9. The system for audio data processing according to claim 8, wherein each of the de-quantizers de-quantizes for the respective channel the decode wavelet coefficients thereof by inserting a predetermined number of zero bit planes starting from the least significant bit to a detected maximum number of bits in each of the wavelet coefficients.

10. The system for audio data processing according to claim 8, wherein the sub-system for audio data de-compression further comprises multiple buffers and additional embedded block decoders, wherein the multiple buffers operate in turn to locate and take the de-quantized wavelet coefficients from the embedded block coders to the 2-D arrays by segments.

11. The system for audio data processing according to claim 8, wherein the sub-system for audio data de-compression further comprises means for rotating each of the 2D-arrays to a new orientation for bit-plane memory access.

12. The system for audio data processing according to claim 11, wherein said means for rotating maps data addresses in each the 2D-arrays with the new orientation thereby retrieving data thereform by bit-plane therein.

13. The system for audio data processing according to claim 8, wherein the sub-system for audio data de-compression further comprises RAM, and means for retrieving multiple sample data in a column of each of the code blocks with connected-neighbor data and storing the retrieved data in the RAM.

14. A system for audio data processing including a sub-system for audio data compression comprising:

an analog to digital converter converting analog audio signals into digital audio signals;

a segment-based multi-channel splitter splitting the digital audio signals into multiple audio channels and segmenting split signals in each of the multiple audio channels into a plurality of segments;

a plurality of multi-level 1D discrete wavelet transformers each of which discrete wavelet transforms one-dimensionally for a respective one of the multiple audio channels each of the segments thereof in sequence and recursively through a predetermined number of filtering levels into wavelet coefficients;

a plurality of quantizers each of which quantizes for the respective channel the wavelet coefficients thereof;

a multiplexer multiplexing quantized wavelet coefficients of the multiple audio channels into a plurality of 2-D arrays; and an embedded block coder coding the 2-D arrays into a plurality of code blocks, discarding some of the code blocks, truncating a bit stream embedded in each of the remaining code blocks, and stringing the truncated bit stream embedded in each of the remaining code blocks into a compressed data stream, wherein the sub-system for audio data compression further comprises means including a sub-system for audio data compression comprising;

an analog to digital converter converting analog audio signals into digital audio signals;

a segment-based multi-channel splitter splitting the digital audio signals into multiple audio channels and segmenting split signals in each of the multiple audio channels into a plurality of segments;

a plurality of multi-level 1D discrete wavelet transformers each of which discrete wavelet transforms one-dimensionally for a respective one of the multiple audio channels each of the segments thereof in sequence and recursively through a predetermined number of filtering levels into wavelet coefficients:

a plurality of quantizers each of which quantizes for the respective channel the wavelet coefficients thereof;

a multiplexer multiplexing quantized wavelet coefficients of the multiple audio channels into a plurality of 2-D arrays;

an embedded block coder coding the 2-D arrays into a plurality of code blocks, discarding some of the code blocks, truncating a bit stream embedded in each of the remaining code blocks, and stringing the truncated bit stream embedded in each of the remaining code blocks into a compressed data stream; and means for rotating each of the 2D-arrays to a new orientation for bit-plane memory access for rotating each of the 2D-arrays to a new orientation for bit-plane memory access, wherein said means for rotating maps data addresses in each the 2D-arrays with the new orientation thereby retrieving data thereform by bit-plane therein.

15. A system for audio data processing including a sub-system for audio data compression comprising:

an analog to digital converter converting analog audio signals into digital audio signals;

a segment-based multi-channel splitter splitting the digital audio signals into multiple audio channels and segmenting split signals in each of the multiple audio channels into a plurality of segments;

a plurality of multi-level 1D discrete wavelet transformers each of which discrete wavelet transforms one-dimensionally for a respective one of the multiple audio channels each of the segments thereof in sequence and recursively through a predetermined number of filtering levels into wavelet coefficients;

a plurality of quantizers each of which quantizes for the respective channel the wavelet coefficients thereof;

a multiplexer multiplexing quantized wavelet coefficients of the multiple audio channels into a plurality of 2-D arrays;

an embedded block coder coding the 2-D arrays into a plurality of code blocks, discarding some of the code blocks, truncating a bit stream embedded in each of the remaining code blocks, and stringing the truncated bit stream embedded in each of the remaining code blocks into a compressed data stream;

means for rotating each of the 2D-arrays to a new orientation for bit-plane memory access; and an OR-Bitmax finder for finding a maximum number of bits in each of the 2-D arrays by counting bits starting on a first non-zero bit from the most significant bit in each of the wavelet coefficients.

16. A system for audio data processing including a subsystem for audio data compression comprising:

an analog to digital converter converting analog audio signals into digital audio signals;

a non-segment-based multi-channel splitter splitting digital audio signals into multiple audio channels without segmenting signals in each of the multiple audio channels;

a plurality groups of 1D discrete wavelet transformers, each of the groups including a predetermined number of 1D discrete wavelet transformers which discrete wavelet transform one-dimensionally for a respective one of the multiple audio channels split signals thereof and through the predetermined number of filtering levels into wavelet coefficients;

a plurality of quantizers each of which quantizes for the respective channel the wavelet coefficients thereof;

a multiplexer multiplexing quantized wavelet coefficients of the multiple audio channels into one data stream and segmenting the data stream into segments;

an embedded block coder coding the segments into a plurality of code blocks, discarding some of the code blocks, truncating a bit stream embedded in each of the remaining code blocks, and stringing the truncated bit stream embedded in each of the remaining code blocks into a compressed data stream;

means for rotating each of the 2D-arrays to a new orientation for bit-plane memory access; and an OR-Bitmax finder for finding a maximum number of bits in each of the 2-D arrays by counting bits starting on a first non-zero bit from the most significant bit in each of the wavelet coefficients.

17. A system for audio data processing including a subsystem for audio data compression comprising:

an analog to digital converter converting analog audio signals into digital audio signals;

a non-segment-based multi-channel splitter splitting digital audio signals into multiple audio channels without segmenting signals in each of the multiple audio channels;

a plurality groups of 1D discrete wavelet transformers, each of the groups including a predetermined number of 1D discrete wavelet transformers which discrete wavelet transform one-dimensionally for a respective one of the multiple audio channels split signals thereof and through the predetermined number of filtering levels into wavelet coefficients;

a plurality of quantizers each of which quantizes for the respective channel the wavelet coefficients thereof;

a multiplexer multiplexing quantized wavelet coefficients of the multiple audio channels into one data stream and segmenting the data stream into segments;

an embedded block coder coding the segments into a plurality of code blocks, discarding some of the code blocks, truncating a bit stream embedded in each of the remaining code blocks, and stringing the truncated bit stream embedded in each of the remaining code blocks into a compressed data stream;

RAM; and means for retrieving multiple sample data in a column of each of the code blocks with connected-neighbor data and storing the retrieved data in the RAM.

18. A system for audio data processing including a subsystem for audio data compression comprising:

an analog to digital converter converting analog audio signals into digital audio signals;

a non-segment-based multi-channel splitter splitting digital audio signals into multiple audio channels without segmenting signals in each of the multiple audio channels;

a plurality groups of 1D discrete wavelet transformers, each of the groups including a predetermined number of 1D discrete wavelet transformers which discrete wavelet transform one-dimensionally for a respective one of the multiple audio channels split signals thereof and through the predetermined number of filtering levels into wavelet coefficients;

a plurality of quantizers each of which quantizes for the respective channel the wavelet coefficients thereof;

a multiplexer multiplexing quantized wavelet coefficients of the multiple audio channels into one data stream and segmenting the data stream into segments;

an embedded block coder coding the segments into a plurality of code blocks, discarding some of the code blocks, truncating a bit stream embedded in each of the remaining code blocks, and stringing the truncated bit stream embedded in each of the remaining code blocks into a compressed data stream;

means for rotating each of the 2D-arrays to a new orientation for bit-plane memory access, wherein said means for rotating maps data addresses in each the 2D-arrays with the new orientation thereby retrieving data thereform by bit-plane therein.

* * * * *